(12) United States Patent
Hozumi et al.

(10) Patent No.: US 9,389,249 B2
(45) Date of Patent: Jul. 12, 2016

(54) CURRENT DETECTOR

(71) Applicant: AISIN AW CO., LTD., Anjo-shi, Aichi-ken (JP)

(72) Inventors: Yuya Hozumi, Toyota (JP); Keisuke Nishimura, Kariya (JP); Subrata Saha, Anjo (JP)

(73) Assignee: AISIN AW CO., LTD., Anjo (JP)

( * ) Notice: Subject to any disclaimer, the term of this patent is extended or adjusted under 35 U.S.C. 154(b) by 207 days.

(21) Appl. No.: 14/233,035

(22) PCT Filed: Oct. 17, 2012

(86) PCT No.: PCT/JP2012/076844
§ 371 (c)(1),
(2) Date: Jan. 15, 2014

(87) PCT Pub. No.: WO2013/058282
PCT Pub. Date: Apr. 25, 2013

(65) Prior Publication Data
US 2014/0139203 A1     May 22, 2014

(30) Foreign Application Priority Data

Oct. 17, 2011    (JP) ................................. 2011-228107

(51) Int. Cl.
    *G01R 1/20*         (2006.01)
    *G01R 15/18*       (2006.01)
    *G01R 33/00*       (2006.01)
    *G01R 19/00*       (2006.01)
    *G01R 15/14*       (2006.01)
    *G01R 15/20*       (2006.01)

(52) U.S. Cl.
    CPC .......... *G01R 19/0092* (2013.01); *G01R 15/148* (2013.01); *G01R 15/207* (2013.01)

(58) Field of Classification Search
    CPC ........... G01R 1/20; G01R 15/18; G01R 33/00
    USPC .................................................. 324/117, 126
    See application file for complete search history.

(56) References Cited

U.S. PATENT DOCUMENTS

| 7,525,300 B2 * | 4/2009 | Watanabe .......... G01R 19/2513 |
| | | 324/117 R |
| 2006/0082357 A1 * | 4/2006 | Tsukamoto ............ G01R 15/20 |
| | | 324/126 |

FOREIGN PATENT DOCUMENTS

| JP | A-2004-61217 | 2/2004 |
| JP | A-2006-162309 | 6/2006 |
| JP | A-2008-22645 | 1/2008 |
| JP | A-2008-58035 | 3/2008 |
| JP | A-2008-128915 | 6/2008 |

OTHER PUBLICATIONS

International Search Report issued in International Patent Application No. PCT/JP2012/076844 dated Nov. 13, 2012.

\* cited by examiner

*Primary Examiner* — Tung X Nguyen
*Assistant Examiner* — Neel Shah
(74) *Attorney, Agent, or Firm* — Oliff PLC (57) ABSTRACT

A current detector that detects, based on output signals of N coreless current sensors, where N is a natural number of 3 or more, currents flowing in N conductors in a circuit connected so that the sum of the currents flowing in the N conductors becomes zero. The current detector has a signal-current correlation acquiring section that acquires a signal-current correlation representing a correlation between the output signals of the N coreless current sensors and the currents flowing in the N conductors. Furthermore, a current calculating section that calculates the currents flowing in the N conductors based on the output signals of all the N coreless current sensors by using the signal-current correlation.

7 Claims, 7 Drawing Sheets

CURRENT DETECTOR

INCORPORATION BY REFERENCE

The disclosure of Japanese Patent Application No. 2011-228107 filed on Oct. 17, 2011 including the specification, drawings and abstract is incorporated herein by reference in its entirety.

BACKGROUND OF THE INVENTION

The present invention relates to current detectors that detect, based on output signals of N coreless current sensors (where N is a natural number of 3 or more), currents flowing in N conductors in a circuit connected so that the sum of the currents flowing in the N conductors becomes zero.

DESCRIPTION OF THE RELATED ART

Regarding such current detectors, a technique of detecting currents based on output signals of current sensors is already known in the art as described in, e.g., Japanese Patent Application Publication No. 2008-22645 (JP 2008-22645 A) shown below. In the technique described in JP 2008-22645 A, each current sensor is a current sensor including a magnetic flux collecting core extending around a conductor as a detection target, and each current sensor can detect magnetic flux density of a magnetic field of only the target conductor to which the current sensor is attached, and can calculate the current of the target conductor.

SUMMARY OF THE INVENTION

However, in a device that detects currents based on output signals of coreless current sensors including no magnetic flux collecting core extending around a conductor as in the present invention, the current flowing in each conductor affects the output signals of all the coreless current sensors. Accordingly, the output signals of the coreless current sensors are such signals that all the currents flowing in the conductors affect each other, and the current flowing in each conductor cannot be easily detected with high accuracy based on the output signals of the coreless current sensors.

A current detector is therefore desired which can accurately detect a current flowing in each conductor based on output signals of a plurality of coreless current sensors.

According to an aspect of the present invention, a current detector that detects, based on output signals of N coreless current sensors (where N is a natural number of 3 or more), currents flowing in N conductors in a circuit connected so that the sum of the currents flowing in the N conductors becomes zero is characterized by including: a signal-current correlation acquiring section that acquires a signal-current correlation representing a correlation between the output signals of the N coreless current sensors and the currents flowing in the N conductors; and a current calculating section that calculates the currents flowing in the N conductors based on the output signals of all the N coreless current sensors by using the signal-current correlation.

According to the above configuration, the currents flowing in the N conductors can be calculated based on the output signals of all the N coreless current sensors by using the signal-current correlation between the output signals of the N coreless current sensors and the currents flowing in the N conductors. That is, the current of each conductor can be accurately calculated based on the output signals of the same number of coreless current sensors as the conductors.

The signal-current correlation may be a correlation in which a relational expression that calculates the current flowing in one of the conductors by multiplying each of the output signals of the N coreless current sensors by a corresponding one of N signal sensitivity coefficients preset to a value other than zero is set for each of the N conductors.

According to this configuration, the current flowing in each conductor can be calculated by using the relational expression for current calculation which is set for each conductor. Each of the signal sensitivity coefficients by which a corresponding one of output signals of the N coreless current sensors is multiplied is set to a value other than zero. Accordingly, the influence of the current of each conductor on the output signals of the coreless current sensors can be reflected in calculation of the current of each conductor. The current of each conductor can thus be calculated accurately.

The signal-current correlation may be inverse characteristics of a current-signal correlation as a correlation in which a relational expression that calculates one of the output signals of the coreless current sensors by multiplying the current flowing in each of the N conductors by a corresponding one of N current sensitivity coefficients other than zero is set for each of all the N coreless current sensors, and the current sensitivity coefficients may be coefficients that represent sensitivities of the output signal of each of the coreless current sensors to the current flowing in a corresponding one of the N conductors.

According to this configuration, the signal-current correlation is the inverse characteristics of the current-signal correlation using the current sensitivity coefficients as the coefficients that represent sensitivities of the output signal of each of the coreless current sensors to the current flowing in the corresponding one of N conductors. The current of each conductor can thus be calculated accurately.

The current detector may further include: an inter-signal correlation acquiring section that acquires an inter-signal correlation representing a correlation between each of the output signals of the (N−1) careless current sensors and the output signal of the remaining one coreless current sensor, the inter-signal correlation being derived based on such a relation that the sum of the currents flowing in the N conductors becomes zero and the signal-current correlation; and an abnormality determining section that determines if the output signals of the N coreless current sensors are normal or abnormal. If it is determined that the output signal of any one of the N coreless current sensors is abnormal, the current calculating section may estimate the output signal of the coreless current sensor determined to be abnormal, based on the output signals of all the normal (N−1) coreless current sensors by using the inter-signal correlation, and may calculate the currents flowing in the N conductors based on the estimated output signal and the output signals of all the normal (N−1) coreless current sensors by using the signal-current correlation.

As described above, in the device that detects the currents based on the output signals of the coreless current sensors, the current flowing in each conductor affects the output signals of all the coreless current sensors. Accordingly, if one of the output signals becomes abnormal, calculation itself using the signal-current correlation cannot be performed, and therefore the currents of all the conductors cannot be calculated. According to the above configuration, however, the inter-signal correlation acquiring section is configured to acquire the inter-signal correlation representing a correlation between each of the output signals of the (N−1) coreless current sensors and the output signal of the remaining one coreless current sensor, which is derived based on such a relation that the sum of the currents flowing in the N conductors becomes zero and the signal-current correlation. Accordingly, if it is determined that any one of the output signals is abnormal, a correct output signal of the sensor determined to be abnormal can be estimated based on the normal (N−1) output signals by using the acquired inter-signal correlation. That is, even if the output signal of one of the sensors is abnormal, the output signal of that sensor can be estimated by using the inter-signal correlation, whereby all the output signals required for calculation using the signal-current correlation can be obtained, and the currents of all the conductors can be calculated.

The inter-signal correlation may be a correlation in which a relational expression that calculates the output signal of the remaining one coreless current sensor by multiplying each of the output signals of the (N−1) coreless current sensors by a corresponding one of (N−1) inter-signal coefficients preset to a value other than zero is set for each of the N coreless current sensors.

According to this configuration, the output signal of the coreless current sensor determined to be abnormal can be estimated by using the relational expression derived based on such a relation that the sum of the currents flowing in the N conductors becomes zero and the signal-current correlation.

The abnormality determining section may stop current application to all of the N conductors if any of the output signals of the N coreless current sensors becomes equal to or higher than a predetermined threshold, and may determine that the output signal of the coreless current sensor which has become equal to or higher than the threshold is abnormal if this output signal of the coreless current sensor does not become lower than the threshold after the current application is stopped.

As described above, in the device that detects the currents based on the output signals of the coreless current sensors, the current flowing in each conductor affects the output signals of all the coreless current sensors. According to the above configuration, current application to all the conductors is stopped if any of the output signals becomes equal to or higher than the threshold. Therefore, abnormality can be determined in the state where the influence of the current flowing in each conductor on the output signal of each coreless current sensor is completely eliminated. This can improve accuracy of determining abnormality.

Each of the N conductors may be connected to a coil of a corresponding one of phases of an N-phase alternating current (AC) rotating electrical machine.

According to this configuration, the above current detector can detect a current flowing in the coil of each phase of the N-phase AC rotating electrical machine, both when the output signal of each coreless current sensor is normal and when it is abnormal. This can enhance control reliability of the AC rotating electrical machine.

DETAILED DESCRIPTION OF THE EMBODIMENTS

Figure 1:
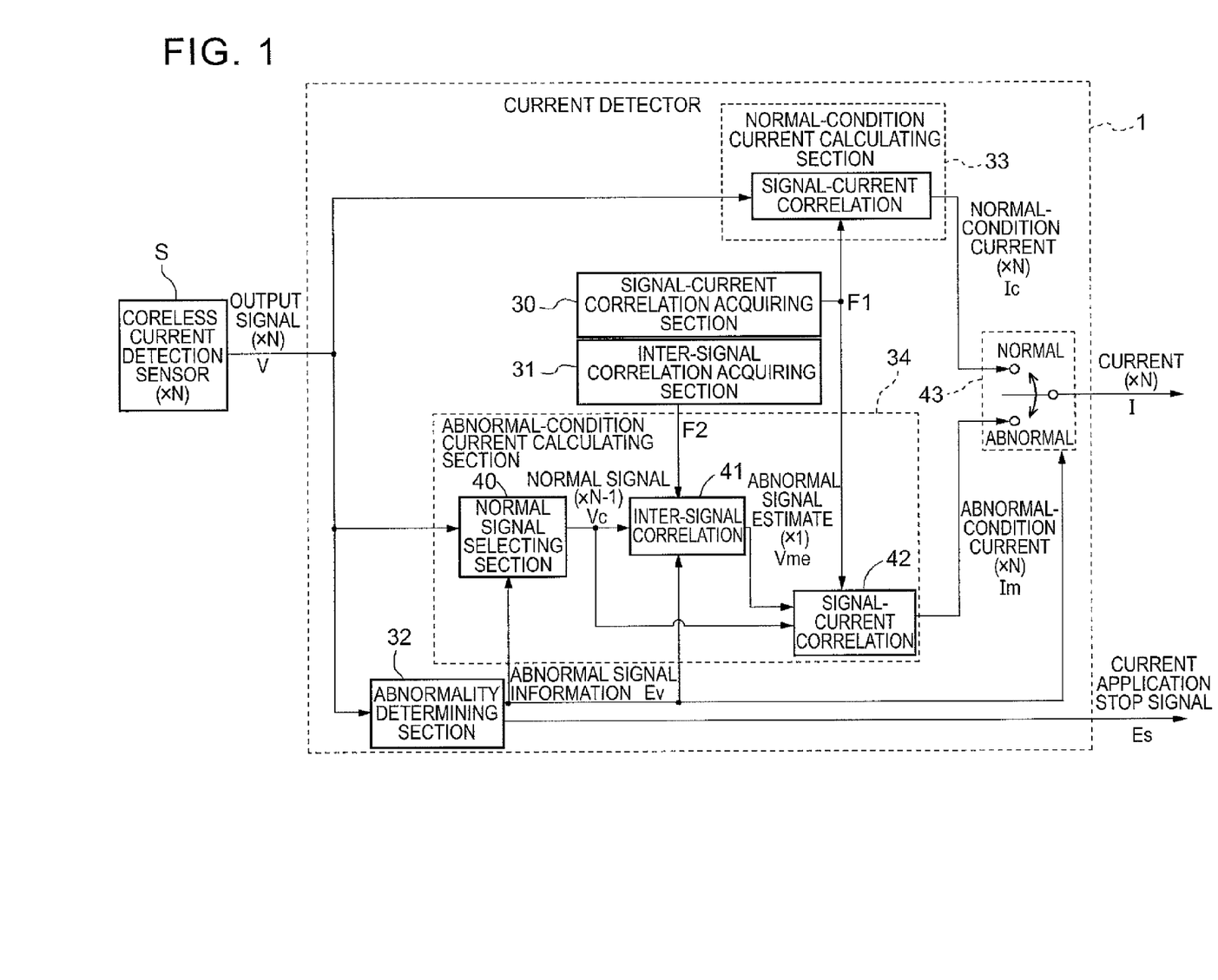
FIG. 1 is a block diagram showing the configuration of a current detector according to an embodiment of the present invention.

An embodiment of the present invention will be described with reference to the accompanying drawings. FIG. 1 is a block diagram schematically showing the configuration of a current detector 1 according to the embodiment. The current detector 1 is a device that detects, based on output signals V of N coreless current sensors S (where N is a natural number of 3 or more), current I flowing in each of N conductors L in a circuit CI connected so that the sum of the currents I flowing in the N conductors L becomes zero as shown in, e.g., FIG. 2.

As shown in FIG. 1, the current detector 1 includes a signal-current correlation acquiring section 30, an inter-signal correlation acquiring section 31, an abnormality determining section 32, a normal-condition current calculating section 33, and an abnormal-condition current calculating section 34. The normal-condition current calculating section 33 and the abnormal-condition current calculating section 34 correspond to the "current calculating section" in the present invention.

The signal-current correlation acquiring section 30 acquires a signal-current correlation F1 representing a correlation between the output signal V of each of the N coreless current sensors S and the current I flowing in each of the N conductors L. The inter-signal correlation acquiring section 31 acquires an inter-signal correlation F2 representing a correlation between each of the output signals V of the (N−1) coreless current sensors S and the output signal V of the remaining one coreless current sensor S. The inter-signal correlation F2 is derived based on such a relation that the sum of the currents I flowing in the N conductors L becomes zero and the signal-current correlation F1.

The abnormality determining section 32 determines if the output signals V of the N coreless current sensors S are normal or abnormal.

If it is determined that the output signals V of all the N coreless current sensors S are normal, the normal-condition current calculating section 33 calculates the currents I flowing in the N conductors L based on the output signals V of all the N coreless current sensors S by using the signal-current correlation F1.

If it is determined that the output signal V of any one of the N coreless current sensors S is abnormal, the abnormal-condition current calculating section 34 estimates the output signal of the coreless current sensor Sm determined to be abnormal (hereinafter referred to as the "abnormal coreless current sensor Sm") based on the output signals V of all the normal (N−1) coreless current sensors S by using the inter-signal correlation F2, and calculates the currents I flowing in the N conductors L based on the estimated output signal (hereinafter referred to as the "abnormal signal estimate Vme") and the output signals Ve of the normal (N−1) coreless current sensors S (hereinafter referred to as the "normal signals Vc") by using the signal-current correlation F1.

1. Circuit CI

Figure 2:
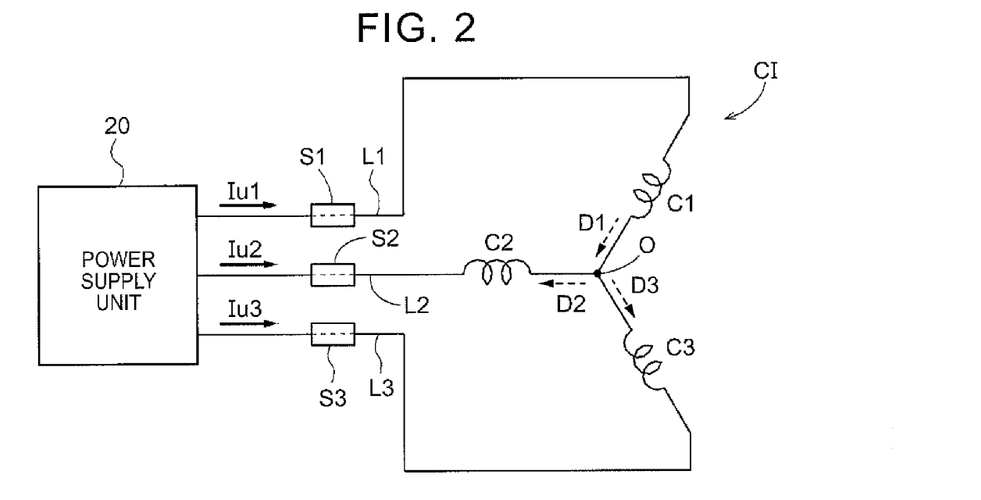
FIG. 2 is a diagram illustrating the configuration of a circuit according to the embodiment of the present invention.

The circuit CI is connected so that the sum of the currents I flowing in the N conductors L becomes zero. The circuit CI according to the present embodiment will be described with respect to an example in which each of the N conductors L is connected to a coil C of a corresponding one of phases of an N-phase alternating current (AC) rotating electrical machine MG. In the present embodiment, as shown in FIG. 2, "N" is set to 3, and the circuit CI includes three conductors L1, L2, L3, three coreless current sensors S1, S2, S3, and three-phase coils C1, C2, C3.

In the present embodiment, the three-phase coils C1, C2, C3 are star-connected. Namely, each of the three-phase coils C1, C2, C3 has its one end connected to a neutral point O and the other end connected to a corresponding one of the conductors L1, L2, L3. The neutral point O is not connected to any elements other than the three-phase coils C1, C2, C3, such as a power supply unit 20.

Each conductor L1, L2, L3 is connected to the power supply unit 20 on the opposite side to the side connected to the three-phase coil C1, C2, C3. Regarding the direction in which the currents I1, I2, I3 flow in the conductors L1, L2, L3, the direction from the power supply unit 20 toward the three-phase coils C1, C2, C3 (toward the circuit CI) is a positive direction, and the opposite direction thereto is a negative direction.

The sum of the currents I1, I2, I3 flowing in the three conductors L1, L2, L3 connected to the star-connected three-phase coils C1, C2, C3 is zero. For example, as shown in FIG. 2, a current D1 flowing from the first conductor L1 into the first coil C1 is divided into the second coil C2 and the third coil C3 at the neutral point O, and the sum of a current D2 flowing from the neutral point O into the second coil C2 and a current D3 flowing from the neutral point O into the third coil C3 is equal to the original current D1 (D1=D2+D3). In this case, in the conductors L1, L2, L3 having the coreless current sensors S1, S2, S3 placed therein, the second current I2 is a negative value of the current D2, the third current I3 is a negative value of the current D3, and the first current I1 is a positive value of the current D1 (I1=D1, I2=−D2, I3=−D3). Accordingly, I1=−I2−I3, and the sum of the currents I1, I2, I3 is zero (I1+I2+I3=0). The coreless current sensors S1, S2, S3 are placed near the conductors L1, L2, L3 that connect the three-phase coils C1, C2, C3 to the power supply unit 20.

2. Power Supply Unit 20

Figure 3:
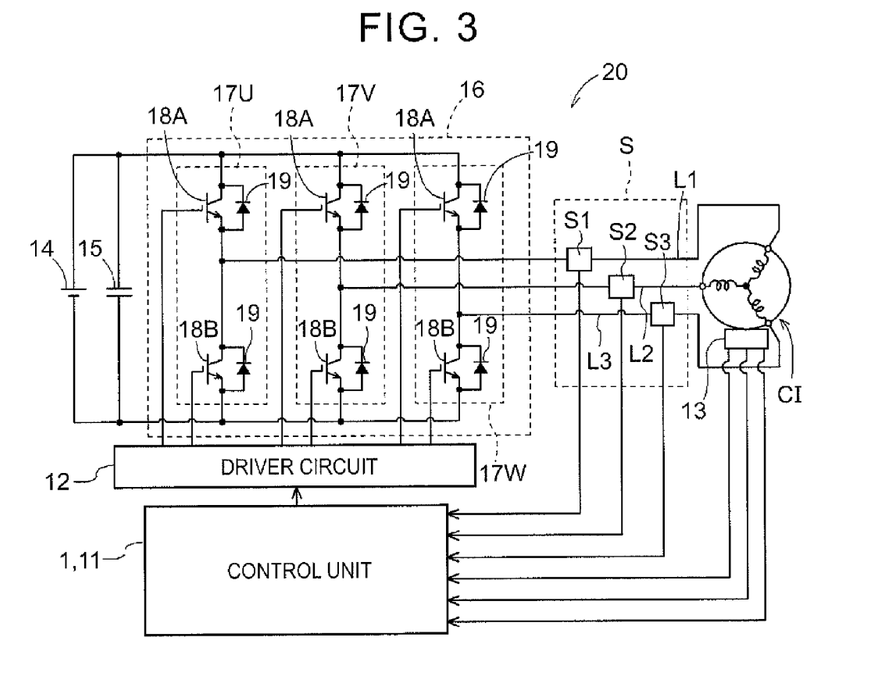
FIG. 3 is a diagram illustrating the current detector and a power supply unit of an AC rotating electrical machine according to the embodiment of the present invention.

As shown in FIG. 3, in the present embodiment, the current detector 1 is incorporated in a control unit 11 that controls the AC rotating electrical machine MG, and forms a part of the control unit 11. The control unit 11 forms a part of the power supply unit 20 of the AC rotating electrical machine MG, and the power supply unit 20 includes a driver circuit 12, a rotation detector 13, a direct current (DC) power supply 14, a smoothing capacitor 15, and an inverter 16 in addition to the control unit 11. The DC power supply 14 is a rechargeable secondary battery such as a battery. The power supply unit 20 converts DC power of the DC power supply 14 to three-phase AC power of a predetermined frequency to supply the three-phase AC power to the AC rotating electrical machine MG. The power supply unit 20 also converts AC power generated by the AC rotating electrical machine MG to DC power to supply the DC power to the DC power supply 14. The rotation detector 13 is formed by a resolver etc., and outputs detection signals of the rotational speed of the AC rotating electrical machine MG and the rotational position of a rotor to the control unit 11. The smoothing capacitor 15 is connected in parallel between a positive electrode terminal and a negative electrode terminal of the DC power supply 14, and smooths the voltage of the DC power supply 14.

The inverter 16 has a plurality of switching elements. It is preferable to use insulated gate bipolar transistors (IGBTs) or metal oxide semiconductor field effect transistors (MOSFETs) as the switching elements. As shown in FIG. 3, in the present embodiment, IGBTs are used as the switching elements. The inverter 16 includes a first leg 17U, a second leg 17V, and a third leg 17W corresponding to the respective phases (three phases: a first phase, a second phase, and a three phase) of the AC rotating electrical machine MG. Each leg 17U, 17V, 17W includes a pair of switching elements formed by an IGBT 18A of an upper arm and an IGBT 18B of a lower arm which are connected in series. Respective flywheel diodes 19 are connected in parallel to the IGBTs 18A, 18B.

The first leg 17U is connected to the first coil C1 of the AC rotating electrical machine MG via the first conductor L1, the second leg 17V is connected to the second coil C2 of the AC rotating electrical machine MG via the second conductor L2, and the third leg 17W is connected to the third coil C3 of the AC rotating electrical machine MG via the third conductor L3. In this case, each conductor L1, L2, L3 electrically connects a point between the emitter of the IGBT 18A of the upper arm and the collector of the IGBT 18B of the lower arm of a corresponding one of the legs 17U, 17V, 17W and the coil of a corresponding one of the phases of the AC rotating electrical machine MG. The collector of the IGBT 18A of the upper arm of each leg 17U, 17V, 17W is connected to the positive electrode terminal of the DC power supply 14, and the emitter of the IGBT 18B of the lower arm of each leg 17U, 17V, 17W is connected to the negative electrode terminal of the DC power supply 14.

The inverter 16 is connected to the control unit 11 via the driver circuit 12, and performs a switching operation according to a control signal that is generated by an inverter control section of the control unit 11. The control unit 11 is configured as an electronic control unit (ECU) having a logic circuit such as a microcomputer, not shown, as a core.

When the AC rotating electrical machine MG functions as an electric motor (performs a power running operation), the inverter 16 converts DC power from the DC power supply 14 to three-phase AC power of a predetermined frequency and current to supply the three-phase AC power to the AC rotating electrical machine MG. When the AC rotating electrical machine MG functions as an electric generator (performs a regeneration operation), the inverter 16 converts three-phase AC power generated by the AC rotating electrical machine MG to DC power to supply the DC power to the DC power supply 14. The AC rotating electrical machine MG is controlled by the control unit 11 to predetermined output torque and a predetermined rotational speed. In this case, the values of the currents flowing in stator coils (the first coil C1, the second coil C2, and the third coil C3) of the AC rotating electrical machine MG are fed back to the control unit 11. The control unit 11 executes proportional-integral control (PI control) or proportional-integral-derivative control (PID control) according to a deviation from a target current to control the AC rotating electrical machine MG. Accordingly, currents flowing in the conductors L1, L2, L3 each provided between a corresponding one of the legs 17U, 17V, 17W of the inverter 16 and the coil of a corresponding one of the phases of the AC rotating electrical machine MG are detected by the current detector 1 that forms a part of the control unit 11.

3. Coreless Current Sensors S

In the present embodiment, the power supply unit 20 includes the same number of coreless current sensors S as the conductors L, namely three coreless current sensors S1, S2, S3, in order to detect the currents I1, I2, I3 flowing in the three conductors L1, L2, L3. Each coreless current sensor S1, S2, S3 detects magnetic flux density of a magnetic field generated by the current flowing in each conductor L1, L2, L3 as a target conductor, and outputs a detection signal according to the detected magnetic flux density.

Typically, when the current I flows in the conductor L, magnetic flux density B at a position separated from the conductor L by a distance r can be given by Expression (1), where "μ0" represents permeability.

[Expression 1]

$$B = \frac{\mu 0}{2\pi} \frac{I}{r} \quad (1)$$

The magnetic flux density B at a predetermined position in a magnetic field that is generated by the current I flowing in the conductor L is proportional to the magnitude of the current I flowing in the conductor L. Accordingly, the currents flowing in the conductors L1, L2, L3 can be detected by using the coreless current sensors S1, S2, S3.

Figure 12:
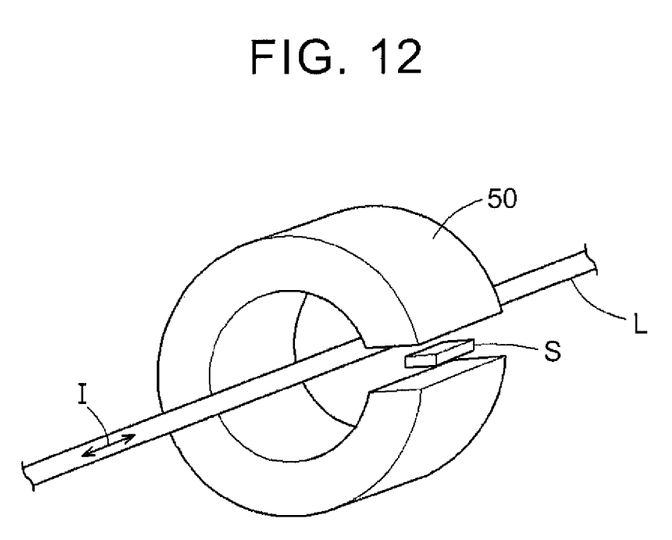
FIG. 12 is a perspective view showing an example of a current sensor having a magnetic flux collecting core.

A magnetic flux collecting core 50 as shown in FIG. 12, namely a magnetic flux collecting core 50 as a magnetic material extending around the conductor such as the conductor L to collect a magnetic flux, is not placed for the coreless current sensor S according to the present embodiment. This magnetic flux collecting core 50 is a magnetic material core having a C-shaped section with a gap, and converges a magnetic flux generated by the current flowing in the conductor L to guide the converged magnetic flux to the current sensor S placed in the gap. In the present embodiment, the coreless current sensor S is a so-called coreless current sensor that is placed without having the magnetic flux collecting core 50 extending around the conductor L. Sensor devices in which a magnetic material that changes the direction of a magnetic flux or locally concentrates the magnetic flux is unified with a Hall element etc. have been used in practical applications. However, even if such a sensor device is used as the coreless current sensor S, the sensor device is herein treated as a careless current sensor as long as it does not use the magnetic flux collecting core 50 extending around the conductor L.

Figure 4:
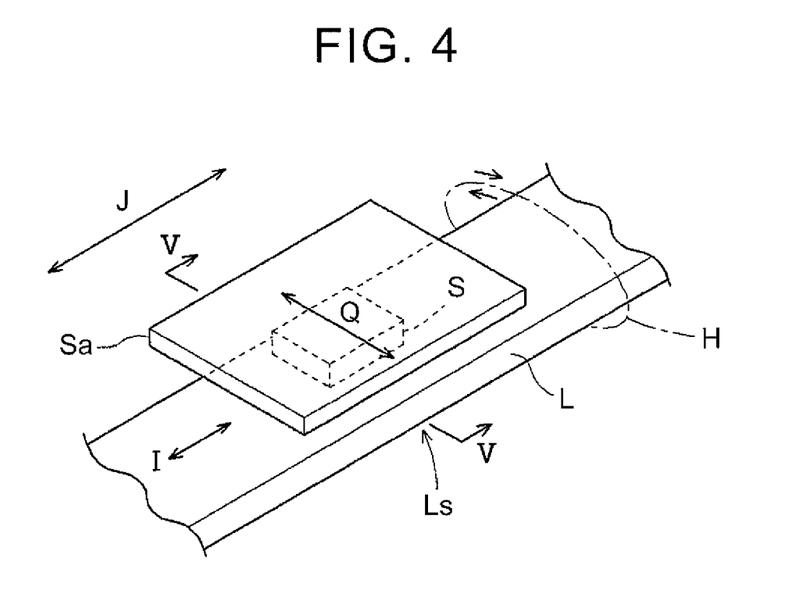
FIG. 4 is a perspective view illustrating the arrangement relation between a coreless current sensor and a conductor according to the embodiment of the present invention.

The coreless current sensor S is formed by a coreless magnetic field detection sensor that does not include a magnetic flux collecting core. Such a magnetic field detection sensor is formed by using, e.g., various magnetic detection elements such as a Hall element, a magnetoresistance (MR) effect element, or a magnetic impedance (MI) element. As shown in FIG. 4, such a magnetic detection element is placed near the conductor L so as not to have a magnetic flux collecting core around the conductor L. Each careless current sensor S does not include a shield against the magnetic field that is generated by the conductor L, in addition to the magnetic flux collecting core. In the present embodiment, the careless current sensor S is formed as an integrated circuit (IC) chip in which a Hall element and a buffer amplifier that at least impedance-converts the output of the Hall element are integrated. As shown in FIG. 4, the coreless current sensor S formed by the IC chip is mounted on a substrate Sa and placed near the conductor L. Although not shown in FIGS. 4 and 5, the substrate Sa is connected to the control unit 11 (current detector 1) by a power line that drives the coreless current sensor S and a signal line that transmits the output signal V of the coreless current sensor S.

Figure 5:
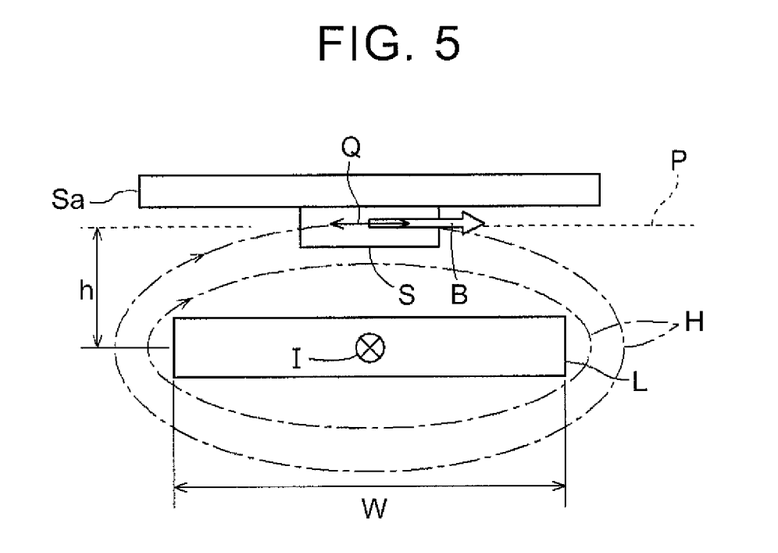
FIG. 5 is a diagram illustrating the arrangement relation between a coreless current sensor and a conductor according to the embodiment of the present invention.

The coreless current sensor S according to the present embodiment is a sensor of the type that is capable of detecting a magnetic flux density component in one direction. In the present embodiment, a part of the conductor L1, L2, L3 over which the coreless current sensor S1, S2, S3 is placed is a plate-like bus bar having a rectangular section. As shown in FIGS. 4 and 5, a magnetic flux detection direction Q of the coreless current sensor S is parallel to the direction of the long side of the section of the conductor L.

As shown in FIGS. 4 and 5, the magnetic flux detection direction Q includes two directions that are opposite to each other. That is, the magnetic flux detection direction Q is a direction parallel to a single straight line, and includes both the direction toward one end of the straight line and the direction toward the other end thereof. The coreless current sensor S can thus detect both magnetic flux density caused by a positive current I and magnetic flux density caused by a negative current I.

In order to facilitate understanding, FIG. 5 shows magnetic lines of force H in the case where the current I flows from the front side to the back side of the sheet on which FIG. 5 is shown, and also shows magnetic flux density B in this case. Since the coreless current sensor S thus detects the magnetic flux density B in the predetermined magnetic flux detection direction Q, the coreless current sensor S is placed near the detection part Ls of the conductor L so that the magnetic flux detection direction Q becomes perpendicular to a detection part extending direction J as a direction in which the detection part Ls of the conductor L extends. A plane parallel to the detection part extending direction J and including the magnetic flux detection direction Q is referred to as the "magnetic flux detection plane P."

As described above, the coreless current sensor S detects magnetic flux density B of a magnetic field H caused by flow of the current I, in order to detect the current I flowing in the conductor L. As a matter of course, the closer to the conductor L it is, the stronger the magnetic field is and the higher the magnetic flux density B is. Accordingly, the coreless current sensor S is placed near the conductor L. The coreless current sensor S may be placed in contact with the conductor L if temperature resistance performance, vibration resistance performance, etc. are satisfied. In the present embodiment, as shown in FIGS. 4 and 5, the coreless current sensor S is placed so as to be separated by a predetermined distance (h) from the conductor L such that the detection center position is substantially aligned with the center on the long side of the section of the conductor L. The coreless current sensor S is placed such that the magnetic flux detection direction Q is perpendicular to the detection part extending direction J. Since the extending direction J of the conductor L corresponds to the direction in which the current I flows, a strong magnetic flux can be obtained in the coreless current sensor S.

In the case where the coreless current sensor S is placed in this manner with respect to the conductor L having a rectangular section, the magnetic flux density B in the coreless current sensor S can be given by Expression (2), where "h" represents the distance between the center of the conductor L (the center of the current I) and the center of the coreless current sensor S (the center of the Hall element) as shown in FIG. 5, and "W" represents the length of the long side of the section of the conductor L.

[Expression 2]

$$B = \frac{\mu 0 I}{2(W+2h)} \quad (2)$$

As in Expression (1), the magnetic flux density B that can be detected by the coreless current sensor S is generally inversely proportional to the distance h between the coreless current sensor S and the conductor L and proportional to the current I of the conductor L.

Figure 6:
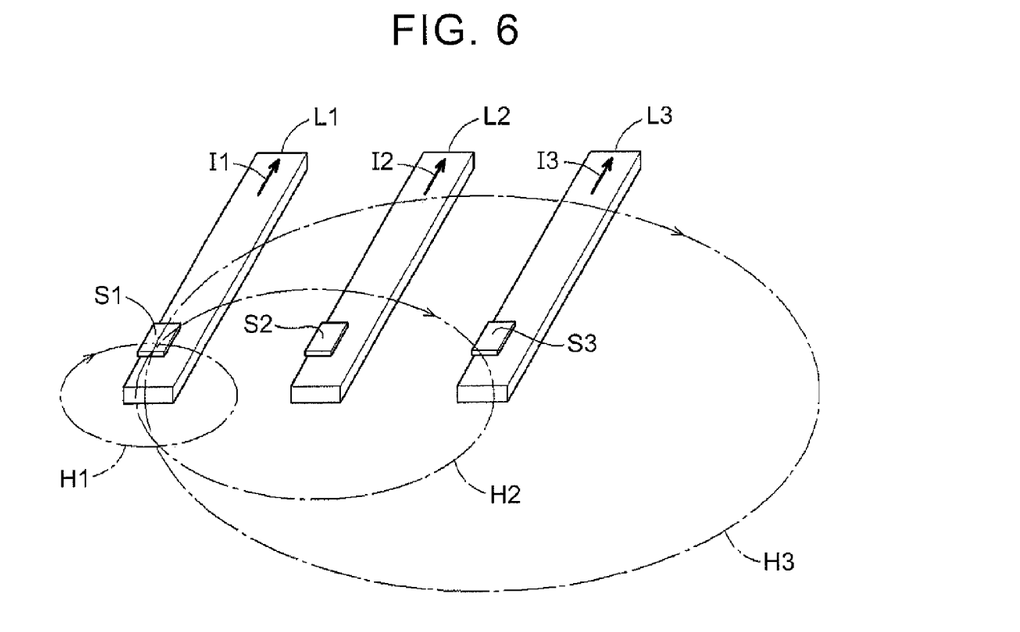
FIG. 6 is a perspective view illustrating the arrangement relation between a plurality of coreless current sensors and conductors according to the embodiment of the present invention.
Figure 7:
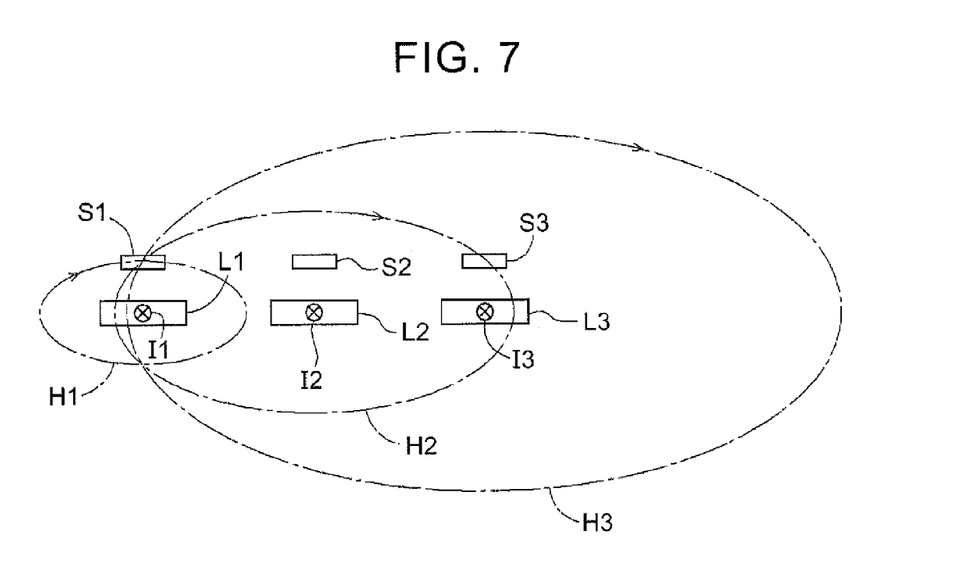
FIG. 7 is a diagram illustrating the arrangement relation between a plurality of coreless current sensors and conductors according to the embodiment of the present invention.

As described above, a shield material etc. is not placed between the conductor L1, L2, L3 and the coreless current sensor S1, S2, S3, and the conductor L1, L2, L3 and the coreless current sensor S1, S2, S3 are placed close to each other. Accordingly, the magnetic flux density that is detected by a single coreless current sensor S includes not only the magnetic flux density of the magnetic field H that is generated from the conductor L located closest to the coreless current sensor S, but also the magnetic flux densities of the magnetic fields that are generated from other conductors L. For example, FIGS. 6 and 7 show an example in which the second conductor L2 is placed between the first conductor L1 and the third conductor L3, and the coreless current sensors S1, S2, S3 are respectively placed near the conductors L1, L2, L3 that are different from each other. In this case, the magnetic flux density that is detected by the first coreless current sensor S1 includes not only the magnetic flux density of a magnetic field H1 that is generated by the first current I1 flowing in the first conductor L1 located closest to the first coreless current sensor S1, but also the magnetic flux densities of magnetic fields H2, H3 that are generated by the currents I2, I3 respectively flowing in the second conductor L2 and the third conductor L3. Accordingly, the output signal V1 of the first coreless current sensor S1 includes not only a component corresponding to the magnetic flux density of the magnetic field H1 that is generated from the first conductor L1, but also components corresponding to the magnetic flux densities of the magnetic fields H2, H3 that are generated from the second conductor L2 and the third conductor L3. Similarly, the output signal V2 of the second coreless current sensor S2 includes not only a component corresponding to the second conductor L2 located closest to the second coreless current sensor S2, but also components corresponding to the first conductor L1 and the third conductor L3, and the output signal V3 of the third coreless current sensor S3 includes not only a component corresponding to the third conductor L3 located closest to the third coreless current sensor S3, but also components corresponding to the first conductor L1 and the second conductor L2.

4. Signal-Current Correlation F1

The current-signal correlation as a correlation between the current I1, I2, I3 flowing in each conductor and the output signal V1, V2, V3 of each coreless current sensor can be given by Expression (3).

[Expression 3]

$$\begin{bmatrix} V1 \\ V2 \\ V3 \end{bmatrix} = \begin{bmatrix} a11 & a12 & a13 \\ a21 & a22 & a23 \\ a31 & a32 & a33 \end{bmatrix} \begin{bmatrix} I1 \\ I2 \\ I3 \end{bmatrix} \quad (3)$$

$$Am = \begin{bmatrix} a11 & a12 & a13 \\ a21 & a22 & a23 \\ a31 & a32 & a33 \end{bmatrix}$$

"a11, a12, . . . " represent coefficients representing sensitivities of each output signal V1, V2, V3 to each current I1, I2, I3 (hereinafter referred to as the "current sensitivity coefficients 'a'"), and can be given by a three-by-three matrix (hereinafter referred to as the "current sensitivity coefficient matrix Am"). As described above, since each of the currents I1, I2, I3 affects the output signals V1, V2, V3 of all the coreless current sensors, each current sensitivity coefficient "a" has a value other than zero.

That is, the current-signal correlation is a correlation in which a relational expression that calculates one of the output signals of the coreless current sensors, namely the output signal Vj, by multiplying the currents I1, I2, I3 flowing in the three conductors L1, L2, L3 by the three current sensitivity coefficients aj1, aj2, aj3 other than zero, respectively, is set for each of all the three coreless current sensors S1, S2, S3. The current sensitivity coefficients aj1, aj2, aj3 are coefficients that represent sensitivities of the output signal Vj of each coreless current sensor to the currents I1, I2, I3 flowing in the three conductors L1, L2, L3, respectively, where j=1, 2, 3.

In the case where the plurality of conductors L are arranged parallel to each other and the magnetic flux detection directions Q of the plurality of coreless current sensors S are parallel to each other as in the present embodiment, each current sensitivity coefficient "a" is generally inversely proportional to the distance between a corresponding one of the careless current sensors S and a corresponding one of the conductors L. For example, the current sensitivity coefficient a12 represents sensitivity of the output signal V1 of the first coreless current sensor S1 to the second current I2 of the second conductor L2, and is generally inversely proportional to the distance between the first careless current sensor S1 and the second conductor L2. Each current sensitivity coefficient "a" can be experimentally identified by measuring the output signal V of each coreless current sensor when a predetermined current is applied to each conductor L.

<Signal-Current Correlation>

Expression (4) is obtained by multiplying both sides of Expression (3) by the inverse of the current sensitivity coefficient matrix Am. Expression (4) is the signal-current correlation F1 according to the present invention, and represents the correlation between the output signal V1, V2, V3 of each coreless current sensor and the current I1, I2, I3 flowing in each conductor.

[Expression 4]

$$\begin{bmatrix} I1 \\ I2 \\ I3 \end{bmatrix} = \begin{bmatrix} b11 & b12 & b13 \\ b21 & b22 & b23 \\ b31 & b32 & b33 \end{bmatrix} \begin{bmatrix} V1 \\ V2 \\ V3 \end{bmatrix} \quad (4)$$

$$Bm = Am^{-1} = \begin{bmatrix} b11 & b12 & b13 \\ b21 & b22 & b23 \\ b31 & b32 & b33 \end{bmatrix}$$

"b11, b12, ..." represent coefficients representing sensitivities of each current I1, I2, I3 to each output signal V1, V2, V3 (hereinafter referred to as the "signal sensitivity coefficients 'b'"), and can be given by a three-by-three matrix (hereinafter referred to as the "output sensitivity coefficient matrix Bm"). Each current sensitivity coefficient "b" has a value other than zero, and each current I1, I2, I3 is determined under the influence of all the output signals V1, V2, V3. In other words, the three conductors L1, L2, L3 and the three coreless current sensors S1, S2, S3 are arranged so that the inverse of the current sensitivity coefficient matrix Am can be calculated and each signal sensitivity coefficient "b" has a value other than zero.

That is, the signal-current correlation is a correlation in which a relational expression that calculates the current Ij flowing in one of the conductors by multiplying the output signals V1, V2, V3 of the three coreless current sensors S1, S2, S3 by the three signal sensitivity coefficients bj1, bj2, bj3 each preset to a value other than zero, respectively, is set for each of the three conductors L1, L2, L3. The signal-current correlation is inverse characteristics of the current-signal correlation described above, where j=1, 2, 3.

5. Inter-Signal Correlation F2

In Expression (4), since each signal sensitivity coefficient "b" has a value other than zero, the values of all the output signals V1, V2, V3 are required to calculate the currents I1, I2, I3.

Accordingly, if any one of the output signals V1, V2, V3 becomes abnormal, the current I1, I2, I3 cannot be calculated only by the signal-current correlation F1 given by Expression (4).

As a solution to this, such a relation that the sum of the currents I1, I2, I3 becomes zero as described above is used. This allows four unknowns, namely the currents I1, I2, I3 and one abnormal output signal, to be calculated because four expressions, namely the three expressions for the currents I1, I2, I3 in Expression (4) and such a relational expression that the sum becomes zero, can be used for the four unknowns.

That is, Expression (6) is obtained by substituting the three expressions for the currents I1, I2, I3 in Expression (4) into such a relational expression (5) that the sum becomes zero, and rearranging the expression.

[Expression 5]

$$I1+I2+I3=0 \quad (5)$$

[Expression 6]

$$(b11+b21+b31)V1+(b12+b22+b32)V2+(b13+b23+b33)V3=0 \quad (6)$$

Expression (7) is obtained by rearranging Expression (6) for each output signal V1, V2, V3. Expression (7) is the inter-signal correlation F2 according to the present invention, and represents an inter-signal correlation as a correlation between each of the output signals of two coreless current sensors and the output signal of the remaining one coreless current sensor. The inter-signal correlation F2 is derived based on such a relation that the sum of the currents I1, I2, I3 flowing in the three conductors becomes zero and the signal-current correlation F1.

[Expression 7]

$$V1 = -\frac{(b12+b22+b32)V2+(b13+b23+b33)V3}{(b11+b21+b31)} \quad (7)$$

$$V2 = -\frac{(b11+b21+b31)V1+(b13+b23+b33)V3}{(b12+b22+b32)}$$

$$V3 = -\frac{(b11+b21+b31)V1+(b12+b22+b32)V2}{(b13+b23+b33)}$$

The first expression in Expression (7) represents the correlation between the second and third output signals V2, V3 and the remaining first output signal V1, the second expression in Expression (7) represents the correlation between the first and third output signals V1, V3 and the remaining second output signal V2, and the third expression in Expression (7) represents the correlation between the first and second output signals V1, V2 and the remaining third output signal V3.

The conductors L2, L2, L3 and the coreless current sensors S1, S2, S3 are arranged so that each of the denominators of the first, second, and third expressions in Expression (7), namely each of the sums of the signal sensitivity coefficients "b" by which the output signals V1, V2, V3 are multiplied in the signal-current correlation F1, (b11+b21+b31), (b12+b22+b32), and (b13+b23+b33), has a value other than zero.

Expression (8) is obtained by rearranging Expression (7).

[Expression 8]

$$V1 = c11V2 + c12V3 \quad (8)$$

$$c11 = -\frac{b12+b22+b32}{b11+b21+b31},\ c12 = -\frac{b13+b23+b33}{b11+b21+b31}$$

$$V2 = c21V1 + c22V3$$

$$c21 = -\frac{b11+b21+b31}{b12+b22+b32},\ c22 = -\frac{b13+b23+b33}{b12+b22+b32}$$

$$V3 = c31V1 + c32V2$$

$$c31 = -\frac{b11+b21+b31}{b13+b23+b33},\ c32 = -\frac{b12+b22+b32}{b13+b23+b33}$$

That is, the inter-signal correlation is a correlation in which a relational expression that calculates the output signal Vj of the remaining one coreless current sensor by multiplying the output signals (all of V1, V2, and V3 except Vj) of the (3−1) coreless current sensors by (3−1) inter-signal coefficients cj1, cj2 preset to a value other than zero, respectively, is set for each of the three coreless current sensors S1, S2, S3, where j=1, 2, 3.

6. Configuration of Current Detector 1

Next, the configuration of the current detector 1 will be described.

The current detector 1 includes an arithmetic processing unit such as a CPU as a core member, and has a storage device such as a random access memory (RAM) capable of writing and reading data from the arithmetic processing unit and a read only memory (ROM) capable of reading data from the arithmetic processing unit, etc. The function units 31 to 34 etc. of the current detector 1 as shown in FIG. 1 are formed by one or both of software (program) stored in the ROM etc. of the current detector 1 and hardware such as an arithmetic circuit provided separately.

6-1. Abnormality Determining Section 32

The abnormality determining section 32 is a function unit that determines whether the output signals V1, V2, V3 of the three coreless current sensors S1, S2, S3 are normal or abnormal. If it is determined that any of the output signals V1, V2, V3 of the three coreless current sensors S1, S2, S3 is abnormal, the abnormality determining section 32 outputs abnormal signal information Ev as information on the output signal Vm of the coreless current sensor Sm determined to be abnormal to each section.

Figure 8:
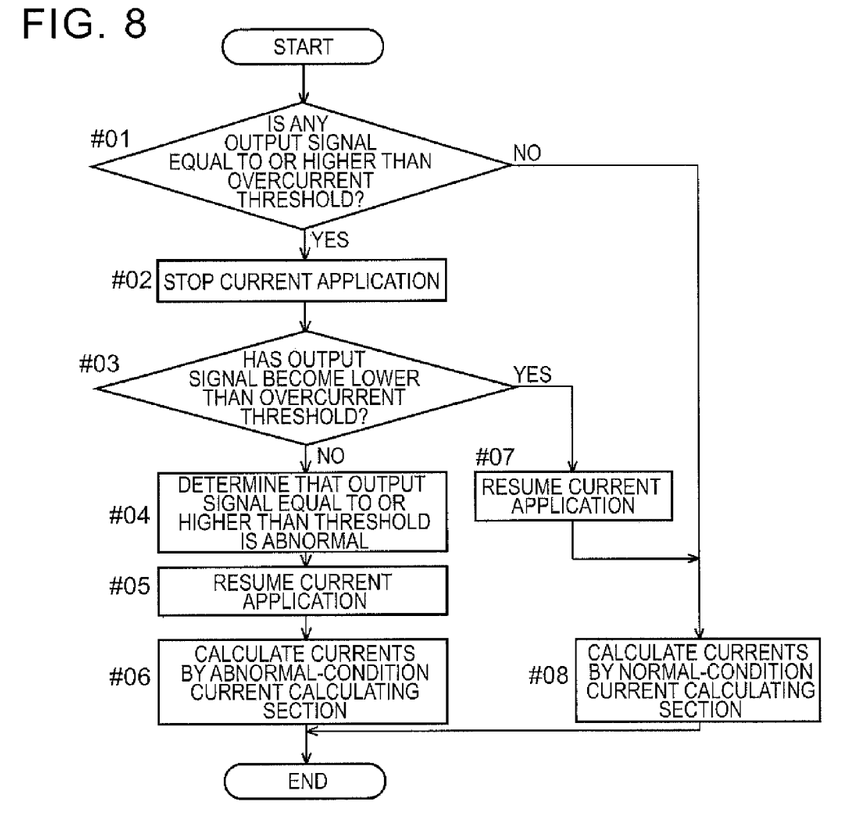
FIG. 8 is a flowchart illustrating processing of the current detector according to the embodiment of the present invention.

In the present embodiment, as shown in the flowchart of FIG. 8, the abnormality determining section 32 stops current application to all of the three conductors L1, L2, L3 (step #02) if any of the output signals V1, V2, V3 of the three coreless current sensors becomes equal to or higher than a predetermined threshold (step #01: Yes). If none of the output signals V1, V2, V3 is equal to or higher than the threshold (step #01: No), the abnormality determining section 32 determines that all of the output signals V1, V2, V3 are normal, and allows the normal-condition current calculating section 33 to calculate the currents (step #08).

In the present embodiment, the threshold is set to an overcurrent determination value that determines an overcurrent. If any of the output signals V1, V2, V3 becomes equal to or higher than the overcurrent determination value, the abnormality determining section 32 outputs a current application stop signal Es to the inverter control section of the control unit 11 to turn off all of the switching elements 18A, 18B of the inverter 16. Current application to all of the conductors L1, L2, L3 is thus stopped.

Thereafter, if the output signal Vm of the coreless current sensor Sm which has become equal to or higher than the threshold does not become lower than the threshold after the current application is stopped (step #03: No), the abnormality determining section 32 determines that the output signal Vm of the coreless current sensor Sm is abnormal (step #04). The abnormality determining section 32 resumes current application to the three conductors L1, L2, L3 (step #05), and allows the abnormal-condition current calculating section 34 to calculate the currents (step #06).

If the output signal Vm of the coreless current sensor Sm becomes lower than the threshold after the current application is stopped (step #03: Yes), the abnormality determining section 32 resumes current application to the three conductors L1, L2, L3 (step #07). The abnormality determining section 32 then allows the normal-condition current calculating section 33 to calculate the currents (step #06).

6-2. Signal-Current Correlation Acquiring Section 30

The signal-current correlation acquiring section 30 is a function unit that acquires the signal-current correlation F1 representing the correlation between the output signals V1, V2, V3 of the three coreless current sensors and the currents I1, I2, I3 flowing in the three conductors as given by Expression (4). The signal-current correlation acquiring section 30 acquires a calculation expression of Expression (4) stored in the storage device such as the ROM of the current detector 1, and values of the signal sensitivity coefficient "b" as a coefficient in the calculation expression. The acquired signal-current correlation F1 is output to the normal-condition current calculating section 33 and the abnormal-condition current calculating section 34. Alternatively, the signal-current correlation acquiring section 30 may be configured to acquire only the values of the signal sensitivity coefficient "b" from the storage device, and the normal-condition current calculating section 33 and the abnormal-condition current calculating section 34 may be provided in advance with the calculation expression of Expression (4).

6-3. Inter-Signal Correlation Acquiring Section 31

The inter-signal correlation acquiring section 31 is a function unit that acquires the inter-signal correlation F2 representing the correlation between each of the output signals of two coreless current sensors S and the output signal of the remaining one coreless current sensor S as given by Expression (7). The inter-signal correlation F2 is derived based on such a relation that the sum of the currents I1, I2, I3 flowing in the three conductors becomes zero and the signal-current correlation F1. The inter-signal correlation acquiring section 31 acquires a calculation expression of Expression (7) stored in the storage device such as the ROM of the current detector 1, and values of the signal sensitivity coefficient "b" as a coefficient in the calculation expression. The acquired inter-signal correlation F2 is output to the abnormal-condition current calculating section 34. Alternatively, the inter-signal correlation acquiring section 31 may be configured to acquire only the values of the signal sensitivity coefficient "b" from the storage device, and the abnormal-condition current calculating section 34 may be provided in advance with the calculation expression of Expression (7).

6-4. Normal-Condition Current Calculating Section 33

The normal-condition current calculating section 33 is a function unit that calculates the currents I1, I2, I3 flowing in the three conductors based on the output signals V1, V2, V3 of all the coreless current sensors by using the signal-current correlation F1, if it is determined that the output signals V1, V2, V3 of all the three coreless current sensors are normal.

6-5. Abnormal-Condition Current Calculating Section 34

The abnormal-condition current calculating section 34 estimates the output signal Vme of the abnormal coreless current sensor Sm based on the output signals Vc of the normal two coreless current sensors by using the inter-signal correlation F2, if it is determined that the output signal of one of the three coreless current sensors is abnormal. The abnormal-condition current calculating section 34 is a function unit that calculates the currents I1, I2, I3 flowing in the three conductors based on the obtained abnormal signal estimate Vme and the output signals Vc of the normal two coreless current sensors by using the signal-current correlation F1.

In the present embodiment, a normal signal selecting section 40 is configured to select the output signals Vc of the normal two coreless current sensors from the output signals V1, V2, V3 of the three coreless current sensors based on the abnormal signal information Ev on the abnormal coreless current sensor Sm. The abnormal-condition current calculating section 34 determines which of the expressions of the inter-signal correlation F2 in Expression (7) should be used to calculate the abnormal signal estimate Vme, based on the abnormal signal information Ev.

That is, if the first output signal V1 is abnormal, the abnormal-condition current calculating section 34 estimates the first output signal V1 based on the normal second output signal V2 and the normal third output signal V3 by using the inter-signal correlation F2 of the first expression in Expression (7). If the second output signal V2 is abnormal, the abnormal-condition current calculating section 34 estimates the second output signal V2 based on the normal first output signal V1 and the normal third output signal V3 by using the inter-signal correlation F2 of the second expression in Expression (7). If the third output signal V3 is abnormal, the abnormal-condition current calculating section 34 estimates the third output signal V3 based on the normal first output signal V1 and the normal second output signal V2 by using the inter-signal correlation F2 of the third expression in Expression (7).

Other Embodiments

Lastly, other embodiments of the present invention will be described. The configuration of each embodiment described below may not only be used by itself, but also be combined with any of the configurations of the other embodiments as long as no inconsistency arises.

(1) As shown in FIG. 2, the above embodiment is described with respect to an example in which N is set to 3, the three conductors L1, L2, L3 are respectively connected to the star-connected three-phase coils C1, C2, C3, and the currents I1, I2, I3 flowing in the three conductors L1, L2, L3 are detected based on the output signals of the three coreless current sensors S1, S2, S3. However, embodiments of the present invention are not limited to this. N can be set to any natural number equal to or larger than 3, and the present invention may have any configuration as long as the currents I flowing in the N conductors L in the circuit CI connected so that the sum of the currents I flowing in the N conductors L becomes zero is detected based on the output signals V of the N coreless current sensors S.

Figure 9:
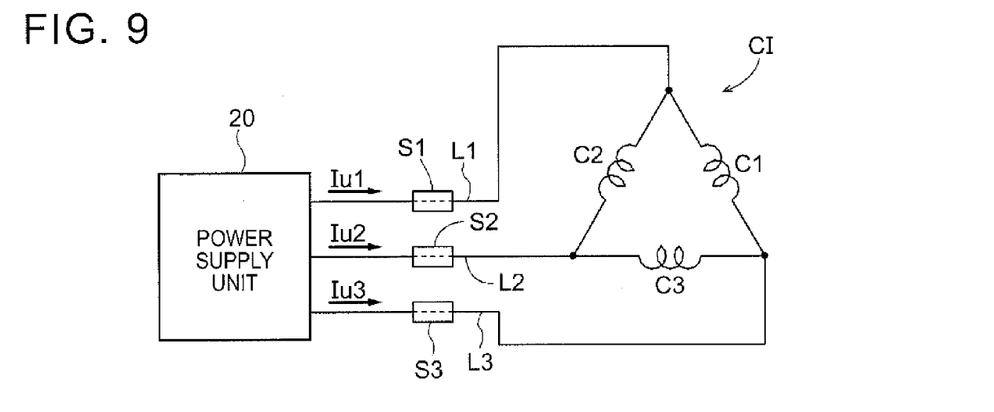
FIG. 9 is a diagram illustrating the configuration of a circuit according to another embodiment of the present invention.

Alternatively, as shown in FIG. 9, even when N is set to 3, the three conductors L1, L2, L3 may be respectively connected to the connections of the delta-connected three-phase coils C1, C2, C3. The sum of the currents I1, I2, I3 flowing in the three conductors L1, L2, L3 is also zero in the circuit C1 of FIG. 9.

Figure 10:
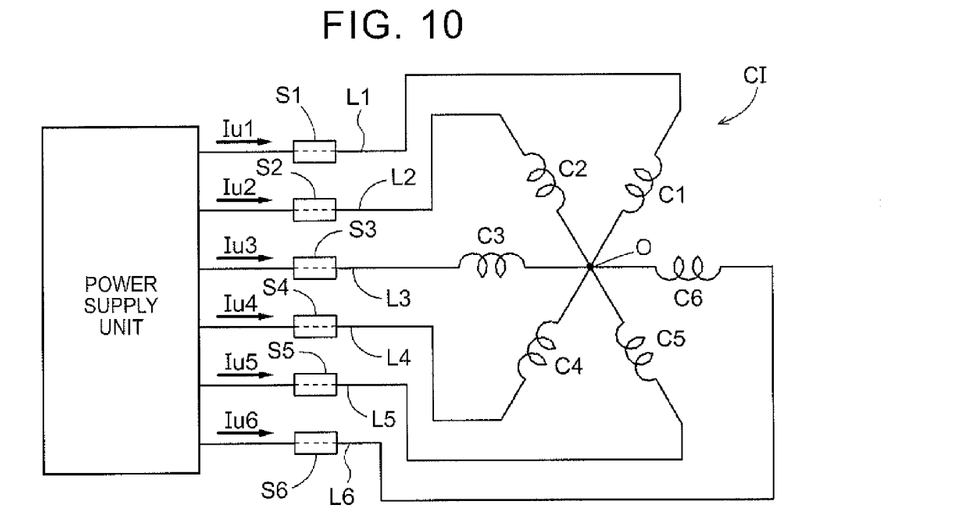
FIG. 10 is a diagram illustrating the configuration of a circuit according to still another embodiment of the present invention.

For example, as shown in FIG. 10, N may be set to 6, six conductors L1, L2 L3, L4, L5, L6 may be respectively connected to star-connected six-phase coils C1, C2, C3, C4, C5, C6, and currents I1, I2, I3, I4, I5, I6 flowing in the six conductors may be detected based on the output signals of six coreless current sensors S1, S2, S3, S4, S5, S6. The sum of the currents I1, I2, I3, I4, I5, I6 flowing in the six conductors is also zero in the circuit CI of FIG. 10.

Figure 11A:
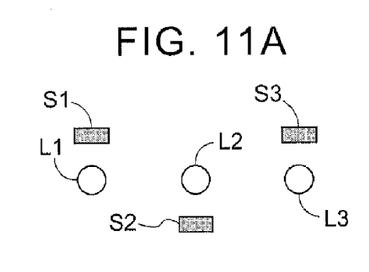
FIGS. 11A, 11B and 11C show diagrams each illustrating the arrangement relation between a plurality of coreless current sensors and conductors according to further embodiments of the present invention.
Figure 11B:
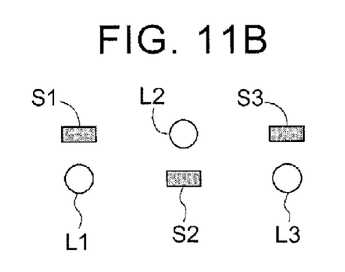
Figure 11C:
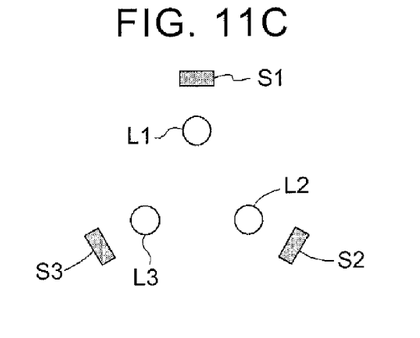

(2) As shown in FIG. 7, the above embodiment is described with respect to an example in which the second conductor L2 is placed between the first conductor L and the third conductor L3 and the coreless current sensors S1, S2, S3 are respectively placed near the conductors L1, L2, L3 that are different from each other. However, embodiments of the present invention are not limited to this. The conductors L1, L2, L3 and the coreless current sensors S1, S2, S3 need only be arranged so that each signal sensitivity coefficient "b" of the signal-current correlation F1 has a value other than zero and each of the sums of the signal sensitivity coefficients "b" by which the output signals V1, V2, V3 are multiplied in the signal-current correlation F1, namely (b11+b21+b31), (b12+b22+b32), and (b13+b23+b33), has a value other than zero. For example, the conductors L1, L2, L3 and the coreless current sensors S1, S2, S3 may be arranged as shown in arrangements of the conductors in the sectional direction in FIGS. 11A, 11B, and 11C.

(3) The above embodiment is described with respect to an example in which the abnormality determining section 32 stops current application to all of the three conductors L1, L2, L3 if any of the output signals V1, V2, V3 becomes equal to or higher than a predetermined threshold, and determines that this output signal is abnormal if this output signal does not become lower than the threshold after the current application is stopped. However, embodiments of the present invention are not limited to this. The abnormality determining section 32 may use any method that detects abnormality of the output signals V1, V2, V3. For example, the abnormality determining section 32 may be configured to monitor a change in output signals V1, V2, V3 over time and determine that any output signal that does not change over time is abnormal. Alternatively, the abnormality determining section 32 may be configured to estimate the remainder of the output signals based on two output signals by using the inter-signal correlation F2 given by Expression (7), and determine abnormality by comparing each estimated output signal with an actual output signal.

(4) The above embodiment is described with respect to an example in which the respective parts of the conductors L1, L2, L3 over which the coreless current sensors S1, S2, S3 are placed are plate-like bus bars having a rectangular section. However, embodiments of the present invention are not limited to this. The conductors L1, L2, L3 may have any section. For example, the conductors L1, L2, L3 may have a circular, square, or elliptical section.

(5) The above embodiment is described with respect to an example in which the coreless current sensor S is a sensor of the type that is capable of detecting a magnetic flux density component in one direction. However, embodiments of the present invention are not limited to this. The coreless current sensor S may be a sensor of the type that is capable of detecting magnetic flux density components in a plurality of directions.

(6) The above embodiment is described with respect to an example in which the normal-condition current calculating section 33 calculates the currents I1, I2, I3 if it is determined that the output signals of all the three coreless current sensors are normal, and the abnormal-condition current calculating section 34 calculates the currents I1, I2, I3 if it is determined that the output signal of any one of the three coreless current sensors is abnormal. However, embodiments of the present invention are not limited to this. The current detector 1 may not be provided with the abnormal-condition current calculating section 34, the inter-signal correlation acquiring section 31, etc., and only the normal-condition current calculating section 33 may calculate the currents I1, I2, I3.

The present invention can be used preferably for current detectors that detect, based on output signals of N coreless current sensors (where N is a natural number of 3 or more), currents flowing in N conductors in a circuit connected so that the sum of the currents flowing in the N conductors becomes zero.

The invention claimed is:

1. A current detector that detects, based on output signals of N coreless current sensors (where N is a natural number of 3 or more), currents flowing in N conductors in a circuit connected so that a sum of the currents flowing in the N conductors becomes zero, comprising:

a signal-current correlation acquiring section that acquires a signal-current correlation representing a correlation between the output signals of the N coreless current sensors and the currents flowing in the N conductors;

a current calculating section that calculates the currents flowing in the N conductors based on the output signals of all the N coreless current sensors by using the signal-current correlation;

an inter-signal correlation acquiring section that acquires an inter-signal correlation representing a correlation between each output signal from (N−1) coreless current sensors and an output signal of a remaining one coreless current sensor, the inter-signal correlation being derived based on such a relation that the sum of the currents flowing in the N conductors becomes zero and the signal-current correlation; and an abnormality determining section that determines if the output signals of the N coreless current sensors are normal or abnormal, wherein if it is determined that the output signal of any one of the N coreless current sensors is abnormal, the current calculating section estimates the output signal of the coreless current sensor determined to be abnormal, based on the output signals of all the normal (N−1) coreless current sensors by using the inter-signal correlation, and calculates the currents flowing in the N conductors based on the estimated output signal and the output signals of all the normal (N−1) coreless current sensors by using the signal-current correlation.

2. The current detector according to claim 1, wherein the signal-current correlation is a correlation in which a relational expression that calculates the current flowing in one of the conductors by multiplying each of the output signals of the N coreless current sensors by a corresponding one of N signal sensitivity coefficients preset to a value other than zero is set for each of the N conductors.

3. The current detector according to claim 2, wherein the signal-current correlation is inverse characteristics of a current-signal correlation as a correlation in which a relational expression that calculates one of the output signals of the coreless current sensors by multiplying the current flowing in each of the N conductors by a corresponding one of N current sensitivity coefficients other than zero is set for each of all the N coreless current sensors, and the current sensitivity coefficients are coefficients that represent sensitivities of the output signal of each of the coreless current sensors to the current flowing in a corresponding one of the N conductors.

4. The current detector according to claim 1, wherein the inter-signal correlation is a correlation in which a relational expression that calculates the output signal of the remaining one coreless current sensor by multiplying each of the output signals of the (N−1) coreless current sensors by a corresponding one of (N−1) inter-signal coefficients preset to a value other than zero is set for each of the N coreless current sensors.

5. The current detector according to claim 1, wherein the abnormality determining section stops current application to all of the N conductors if any of the output signals of the N coreless current sensors becomes equal to or higher than a predetermined threshold, and determines that the output signal of the coreless current sensor which has become equal to or higher than the threshold is abnormal if this output signal of the coreless current sensor does not become lower than the threshold after the current application is stopped.

6. The current detector according to claim 4, wherein the abnormality determining section stops current application to all of the N conductors if any of the output signals of the N coreless current sensors becomes equal to or higher than a predetermined threshold, and determines that the output signal of the coreless current sensor which has become equal to or higher than the threshold is abnormal if this output signal of the coreless current sensor does not become lower than the threshold after the current application is stopped.

7. The current detector according to claim 1, wherein each of the N conductors is connected to a coil of a corresponding one of phases of an N-phase AC rotating electrical machine.

\* \* \* \* \*